United States Patent [19]

Pascucci

[11] Patent Number: 5,854,770

[45] Date of Patent: Dec. 29, 1998

[54] DECODING HIERARCHICAL ARCHITECTURE FOR HIGH INTEGRATION MEMORIES

[75] Inventor: Luigi Pascucci, Sesto S. Giovanni, Italy

[73] Assignee: SGS-Thomson Microelectronics S.r.l., Brianza Agrate, Italy

[21] Appl. No.: 791,746

[22] Filed: Jan. 30, 1997

[51] Int. Cl.$^6$ .................................................. G11C 8/00
[52] U.S. Cl. ............................. 365/230.03; 365/230.02; 365/230.04; 365/230.06; 395/444
[58] Field of Search ........................ 365/230.03, 230.06, 365/230.02, 230.04, 189.02; 395/444

[56] References Cited

U.S. PATENT DOCUMENTS

| 5,642,323 | 6/1997 | Kotani et al. | 365/230.03 |
| 5,657,265 | 8/1997 | Yoo et al. | 365/230.03 X |

*Primary Examiner*—Do Hyun Yoo
*Attorney, Agent, or Firm*—Allen, Dyer, Doppelt, Milbrath & Gilchrist, P.A.

[57] ABSTRACT

A nonvolatile static memory includes a matrix of elementary cells addressable through bit-lines (columns) and word-lines (rows) mutually orthogonal among each other, the matrix being divided in two orders of subblocks, respectively left and right, aligned in a direction of extension of the word-lines and symmetrical by pairs. At least one row predecoding circuit and a plurality of row decoding circuits are provided for the subblocks. Column predecoding circuits and a plurality of column multiplexers are provided for the subblocks and controlled by the column predecoding circuits. A first main predecoding circuit of the address bus generates a first bus, a second bus and a third bus. In addition, a pair of main row decoding circuits combines signals of the first, second and third buses and generates a resulting number of main row decoding lines, each stimulating respective row decoding circuits of the right and left subblocks. Two pairs of local row predecoding circuits are provided for each of the right and left subblocks, a first pair for word-lines of even order and a second pair for word-lines of odd order of the right and left subblocks, respectively, and are stimulated by the address bus to generate a fourth bus and a fifth bus, respectively.

24 Claims, 18 Drawing Sheets

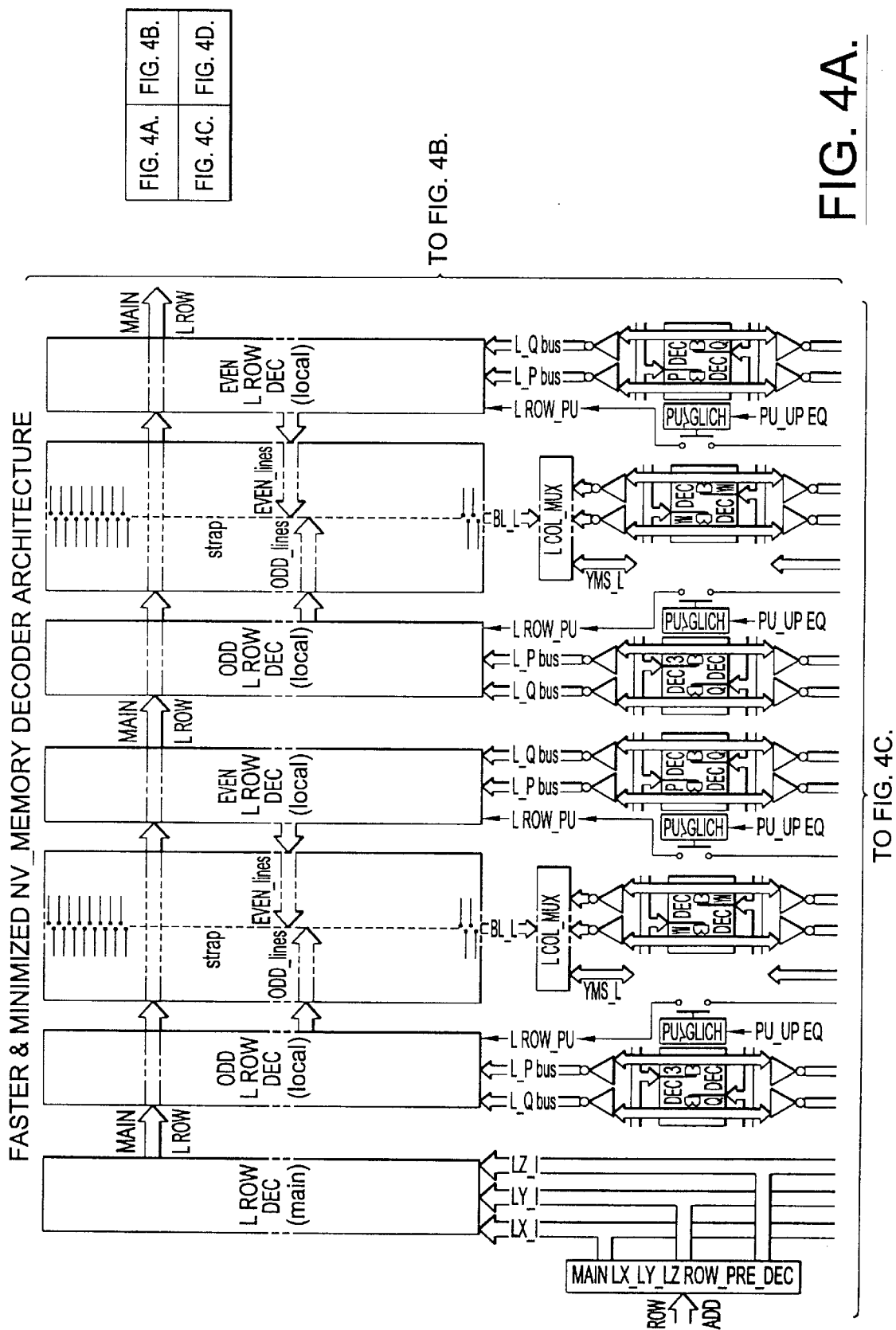

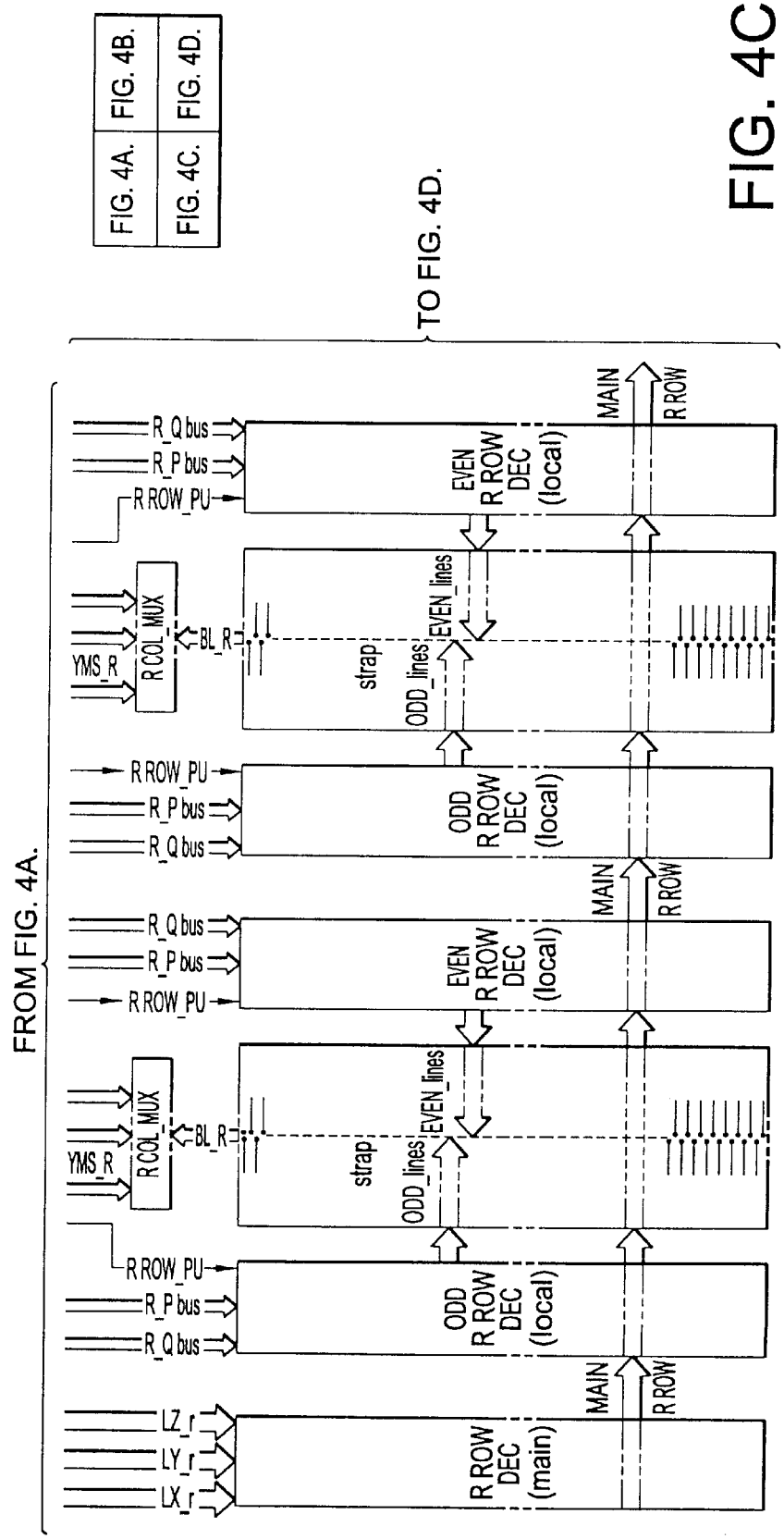

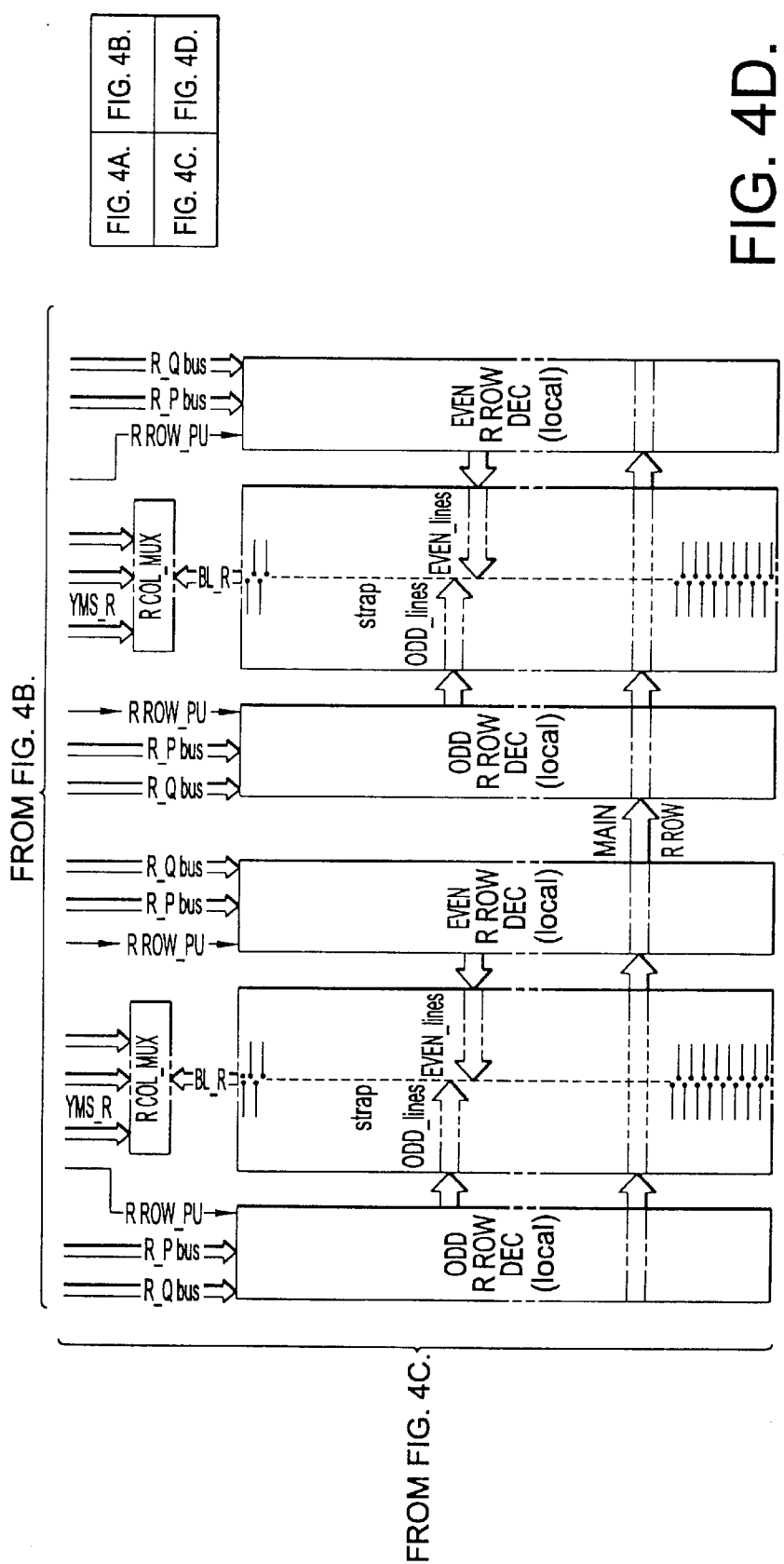

DECODING HIERARCHICAL ARCHITECTURE FOR HIGH INTEGRATION MEMORIES

FIELD OF THE INVENTION

The present invention relates to high integration memory devices such as EPROM, EEPROM, FLASH_EPROM, and, more particularly, to a hierarchical decoding architecture.

BACKGROUND OF THE INVENTION

The decoding circuitry has the function of permitting access to the cell by address data that are input to a memory device during a writing or a reading phase. During a reading phase, selection of a cell for each bit of the output datum is performed. Commonly by row selection, a line of cells is switched-on, whereas through column decoding a particular line (column or bit line) is connected to reading circuitry of the corresponding bit of the output datum. In state of the art high integration memories like EEPROM, EEPROM, FLASH-EPROM, ROM and so forth, in which each elementary cell occupies an area of few square micrometers, the decoding circuitry represents a critical element of the design because of the compelling requirements of compactness, speed and low power consumption.

The realization of the decoding circuitry for higher and higher integration devices is increasingly difficult. Each new technological generation of these devices increases and aggravates the problems which usually concern area requirements always close to the limit of feasibility, increased parasitic electric parameters of the decoding structures, degradation of the efficiency in terms of a reduced speed of multiplexers, and an unavoidable criticality of certain structures. The increment of the integration level and the resulting reduction of the thickness of dielectric layers accentuates the specific capacitances and increases electrical loads.

FIGS. 1, 2 and 3 highlight the peculiar aspects of the architecture of the decoding circuitry commonly implemented in high integration memory devices. In these devices, the array of memory cells is frequently divided into one or more sectors or subblocks, respectively into a right (R) and a left (L) subblock, in the example shown in FIG. 1. Row decoding is carried out by the R_ROW_P and L_ROW_P predecoding blocks, and through the R_ROW_DEC and L_ROW_DEC row decoding blocks. In turn, each row decoding block may manage two adjacent subblocks (right or left), as exemplified in FIG. 2 for two subblocks of the left side (LL and LR). In this way, the scheme becomes symmetrically repetitive in both directions of expansion of the memory size (capacity).

The electrical scheme of known decoding architectures of FIGS. 1 and 2, is highlighted in FIG. 3. The electrical and physical arrangement of known decoding circuits reveals a number of criticalities and drawbacks in view of the growing of the memory capacity and in view of the practical objective of reducing the number of devices. In particular, the number of control lines of the address bus ADD grows to the point of feasibility. Moreover, beside the increase of the capacitive loads of a line, there is a progressive increment of the line resistance because of the reduction of the design width and thickness of the lines themselves. All these factors contribute in increasing the propagation times and thus the delays of selection of the lines. This crucial aspect is highlighted in FIG. 3, whose basic electrical scheme may be recognized in all the lines, with an evident serialization (cumulative effect) of the electrical parameters (RC) of the lines.

In practice, the selection buffers (of row selection in the example depicted in FIG. 3) tend to feel the effect of an excessive increase of the product of the resistance (R) and capacitance (C) of each line, be they either predecoder lines or matrix selection lines. This is so particularly for the row selection lines which, due to the fact that they are normally patterned in poly, are intrinsically slow because they are characterized by relatively high values of resistance and of capacitance (word-line capacitance).

A technique for reducing the word-line resistance is that of short-circuiting each polysilicon line with a more conductive overhanging layer (metal 2). However, this technique implies a more severe reproducibility criteria that poses limits for the scalability of the features, increases the criticality, and has negative repercussions on production yields.

SUMMARY OF THE INVENTION

Confronted with these difficulties it has now been found, and is the object of the present invention, novel and advantageous hierarchical decoding architecture for word-lines (rows) selection and deliberately repetitive for bit-lines (columns) selection, capable of easing certain critical ties, to reduce the resistance of the control lines, minimize their number, and improve the performances. This is achieved by fragmenting the otherwise cumulative RC parameters that govern signal propagation speed through the memory, while preserving excellent symmetry characteristics of the memory.

Fundamentally, the architecture of the invention is based on the following criteria:

- subdivision of the whole matrix in several subblocks, two-by-two symmetrical among themselves;
- realization of main row decoding circuits (main predecoder and decoder) along one side of the memory;
- placement along a central aisle (with respect to the central axis of the layout of the memory) of slave circuits of local row predecoding and of optional control circuits (for instance ROW_PULL_UP_GLITCHERS and the like) for each subblock of memory cells;
- realization of slave circuits for local row decoding, with interleaved pointing and central strapping, for each subblock of the memory matrix; such an interleaved pointing with connection implemented in a middle position and with opposite directions of origin greatly relaxes the criticality of the upper most conductive layer (metal 2), which is instrumental to the doubling of the usable space for the implementation of the local row decoder;
- local multiplexers for column selection, repeated several times along the matrix, in a dual and symmetric manner, each controlled by selection lines individually buffered and stimulated by the same local decoder;
- control and activation buses comprising the main address and control lines (ADD, G_ST, D_ST, M_DIS, . . . ) extended along the central aisle between the left and right sectors or subblocks.

By focusing upon the complementary structures that form the complete decoding system and more precisely the row decoding circuitry and the column decoding circuitry, their relevant aspects may be identified as follows.

ROW DECODER

The row decoding circuitries are of the hierarchical type and divide the decoding function into a "main" stage and "local" stage, thus reducing the number of devices required. The areas made available for implementing the decoding circuitry of each block may be increased while doubling the space available for the realization of strapping lines. The strapping lines were necessarily patterned in metal 2 which tended to limit the possibilities of compacting the cells, beyond a certain limit. Moreover, the hierarchical structure:

reduces the fabrication stress;

improves the speed of propagation of signals by virtue of a more efficient layout represented by fragmented lines with a plurality of points of stimulation and a central strapping that improves the speed characteristics;

minimizes the number of stimulation lines, along with the placement of slave circuits of local predecoding along a central aisle and opposite to the local row decoding circuits. (As a consequence, the buses do not need to extend along the entire device and do not bear the whole load but instead only the local one, limiting the predecoding circuits to a transmission function. The local loads of the main address lines are uniquely represented by the local predecoding circuits, which being composed of few transistors, are less burdensome in terms of overall capacitive load. For example, the main address lines may be four and allow for the origination of several groups of sixteen local lines, all simultaneously activated);

the slave circuits for local predecoding, opposite to the respective local row decoding circuits, permit row selection lines to originate on site and simultaneously at different points with attendant advantages both in terms of reduced encumbrance and of the speed of propagation (a smaller tau) as a result of the fragmentation of the lines and of the entire load;

the central location of the local row predecoding circuits allows for the sharing of these predecoding structures by two symmetric subblocks, as well as for exploiting the possibility of balancing and equalizing the lines, which is rather useful in situations involving dynamic enhancement circuits (such as row__pull glitchers) or boost circuits by reducing current absorption from the boost line; and makes the layout readily adaptable to realize a certain memory size by virtue of its high modularity.

COLUMN DECODER

The realization of local column decoding circuits using two separate and individually buffered buses, though having common decoding structures for each block realized with special NAND gates made with a reduced number of transistors and defined S_NAND structure, reduces the encumbrance and improves the performance thanks to the reduction (halving) of the loads and to the segmentation of the line resistances. The segmentation of the multiplexing lines is obtained by subdividing the memory in subblocks, each provided with its own predecoding and distinct buffering structures for both the left and right side; both buffering structures being stimulated by the same local predecoding structure. The local predecoding is made up of two groups of S_NAND structures that produce two distinct buses (YN, YM) each of sixteen lines of which one line at a time is at the logic state "1". The logic product that verifies the coincidence of two lines of the same multiplexer at the logic state "1" singles out the selected column (bit-line). The use of special S_NAND structures instead of more conventional NAND structures, permits by the reduction of the number of devices, a reduction in the load of each main line.

Despite the repetitiveness, the local predecoding structures combined with the respective buffering structures do not overburden the layout as they can be realized within naturally existing areas as determined by the general memory layout. In fact, as will become more evident through the ensuing explanation of the attached drawings, such areas are those normally reserved to the amplifying or programming circuits, and to slave lines that do not use up all the available area according to a common layout of a memory device. A further advantage is the fragmentation of the resistance and capacitance of the lines, with consequent advantages in terms of propagation speed of the signals and of a greater homogeneity of the electrical characteristics among the different subblocks. Moreover, the layout is immediately adaptable for implementing a certain memory capacity by virtue of its highly modular architecture.

BRIEF DESCRIPTION OF THE DRAWINGS

These and other advantages of the invention will become even clearer through the following description of some important embodiments and by referring to the attached drawings, in which:

FIGS. 4A–4D is a high level scheme that shows the whole architecture and the most general aspects of a hierarchical decoding system according to the present invention;

DETAILED DESCRIPTION OF THE PREFERRED EMBODIMENTS

With reference to FIGS. 4A–4D, the hierarchical row decoding architecture of the invention is outlined by the main row predecoding block MAIN LX_LY_LZ ROW_PRE_DEC, by the main row decoding blocks L_ROW_DEC (main) and R_ROW_DEC (main) for the left (L) subblocks and the right (R) subblocks, respectively; by the local row decoding blocks ODD_L_ROW_DEC (local), EVEN_L_ROW_DEC (local), ODD R_ROW_DEC (local) and EVEN R_ROW_DEC (local) and by the respective local row predecoding blocks. The latter are disposed along the central aisle of the memory layout, interleaved by pairs, in the illustrated example, among the relative column predecoding circuits, as described below in more details and shown in FIG. 5B.

As already partially shown in FIGS. 4A–4D, according to a preferred embodiment of the decoding structures of the invention, these are made of special doubly buffered NOR gates, that is with a buffer for the left and right decoder respectively, thus reducing the total number of transistors burdening a generic line and consequently reducing the capacitive load borne by each line, in addition to halving the line resistance. In this regard, it should be pointed out that the latter aspect, despite the highly conductive nature of the metal layer from which the lines are patterned, is not of secondary importance because along with the ever increasing compactness, the thickness and width of the metal lines is reduced, whereas their length is often increased. Thus, their resistance is increased along with the number of the controlled points, and consequently the capacitive loads.

Figure 1:
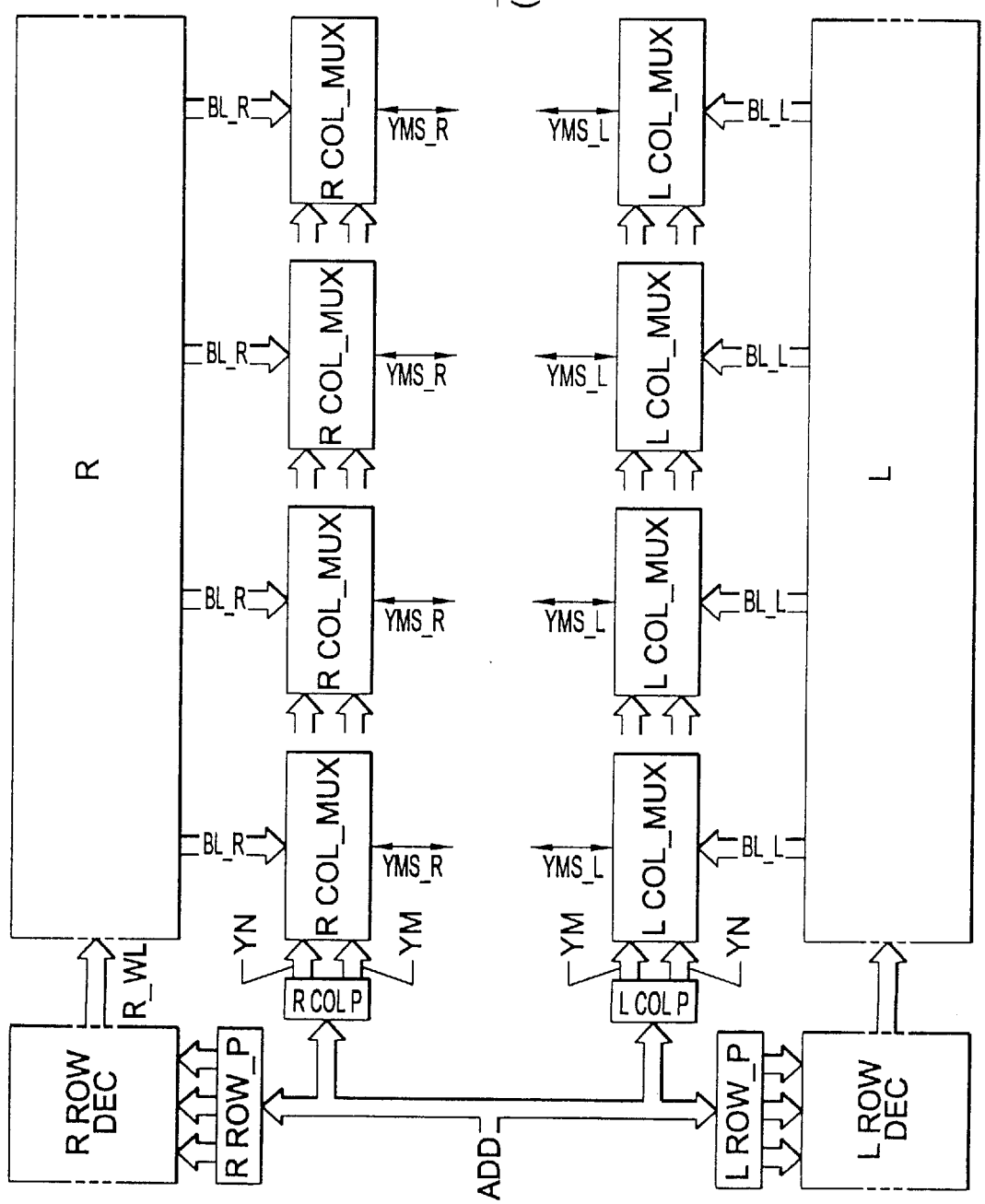
FIGS. 1, 2 and 3, as already mentioned, reproduce schematically and by way of comparison, known decoding architectures of the prior art and their basic electrical schemes of selection lines in the field of nonvolatile memories.
Figures 2, 3:
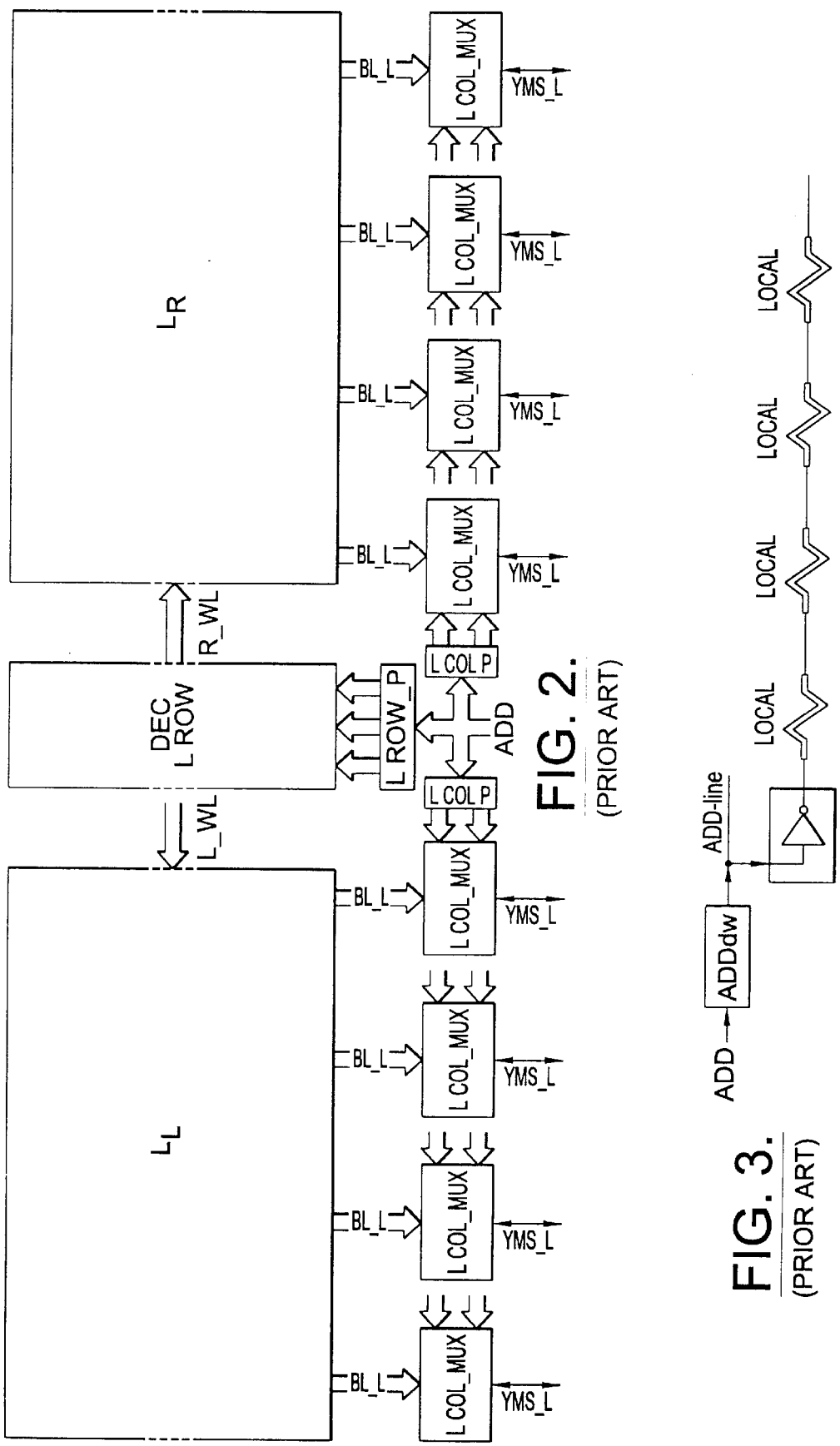
Figure 4B:
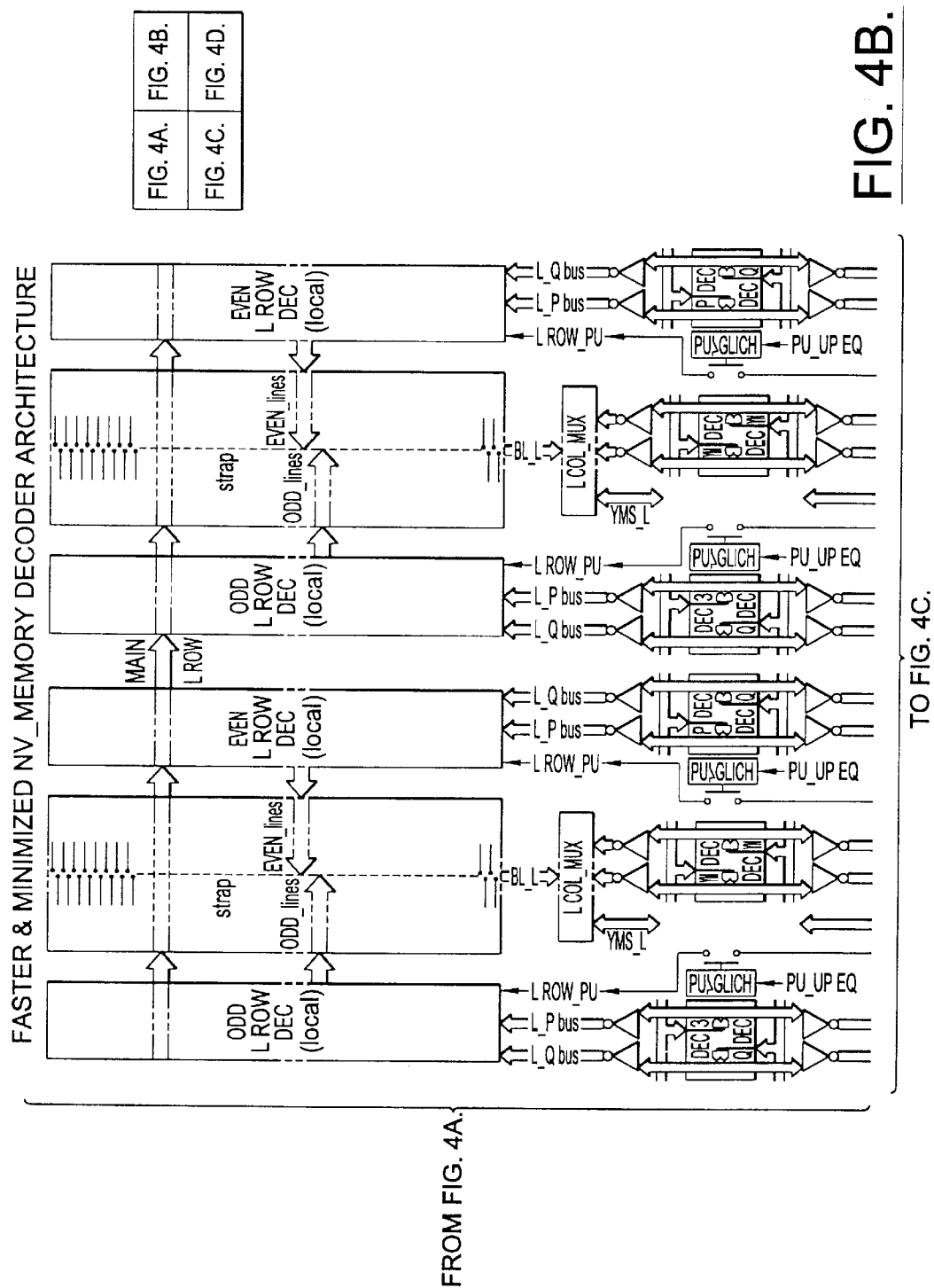
Figure 5A:
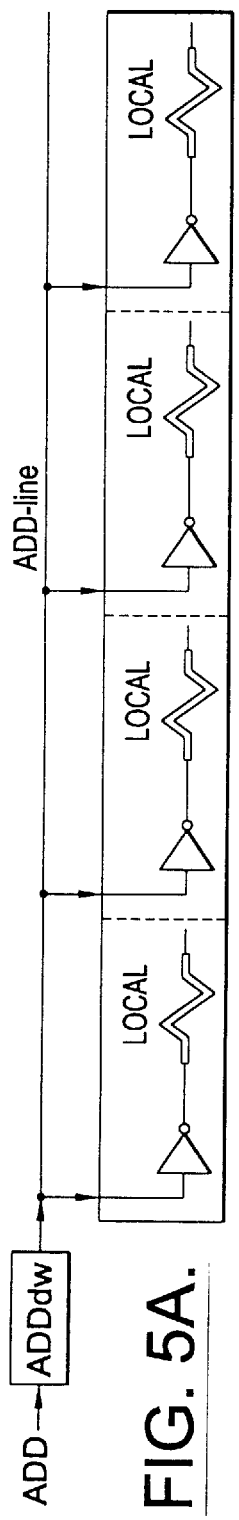
FIGS. 5A and 5B highlight some important features of the general diagram of FIGS. 4A–4D and the different scheme as compared to the scheme of the known architecture.
Figure 5B:
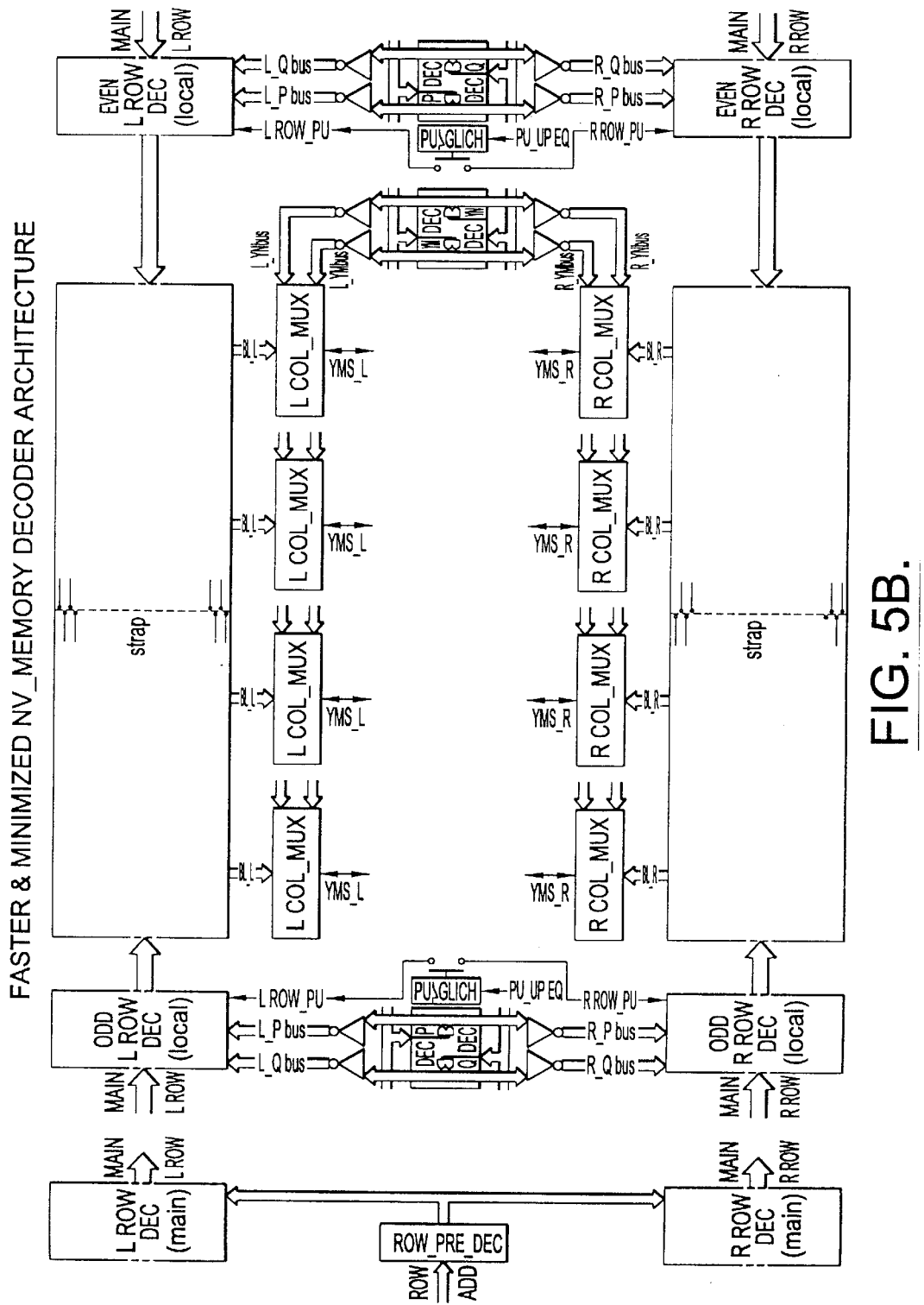

FIG. 3 illustrates the basic electrical scheme according to the prior art. Being that each line is unique, the overall resistance and capacitance parameters correspond to the sum of their respective components and so their product (RC) is maximized and propagation of signals slowed. By contrast, FIG. 5A shows the basic electrical scheme that results from the architecture of the present invention. Each propagation line comprises one main propagation line, which implies the incidence of its total resistance on the RC parameter while the total capacitance associated therewith is minimized (in the illustrated example 4 buffering inverters represent the capacitive load) thus ensuring a relatively low RC value. As depicted, there are four local lines associated with a main line, and each of these local lines is controlled through a buffer. As a result of this arrangement the RC value corresponds to a quarter of the RC value of a conventional arrangement as depicted in FIG. 3. Therefore, the four local lines of the example are practically stimulated simultaneously and ensure a markedly reduced propagation delay compared to that of a known architecture.

In all the exemplified embodiments, the predecoding circuits, as well as the main decoding circuits, select a line in a field of "1", in other words the lines are "active" when at logic state "0". In particular, only the main line that simultaneously verifies LX+LY+LZ=0 is enabled to assume the logic state "0"which will allow for the selection of a local line among a group of 16 local lines associated with each main line.

The so-called GS (Gate Stress) forcing, that typically permits discrimination during testing for technologically unreliable components, takes place by forcing all the primary address lines in either their real or inverted form to logic "0", which is equivalent to a simultaneous selection of all the rows. Comparably, the so-called drain stress (DS) is performed by forcing the disabling lines DIS (right/left) to a logic level "1", that is, by causing the main lines to take the logic state "0", by inhibiting the selection of any one of the local word-lines.

Figure 6:
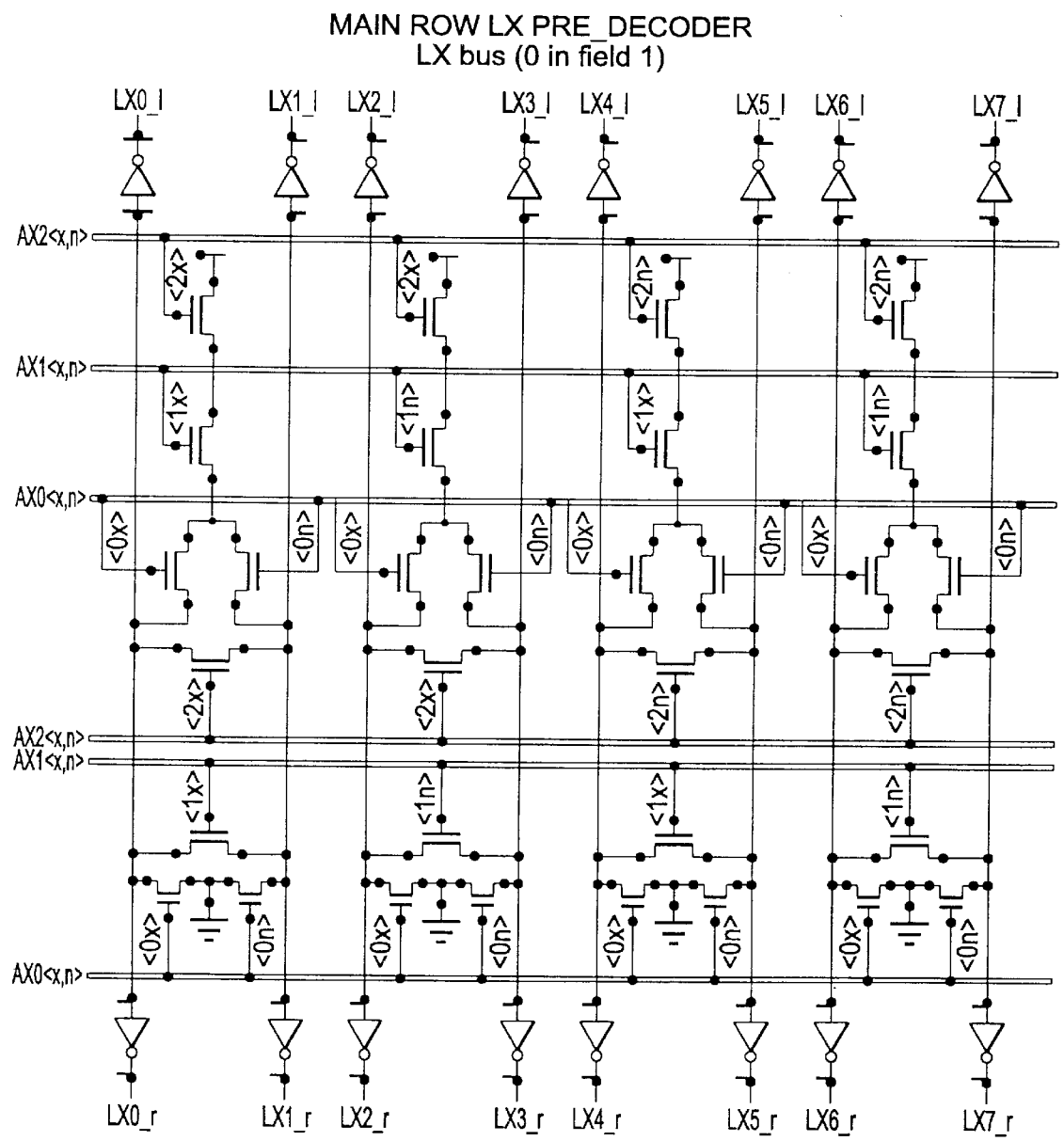
FIGS. 6, 7 and 8 show the circuit diagrams of the main row predecoding structures.
Figure 7:
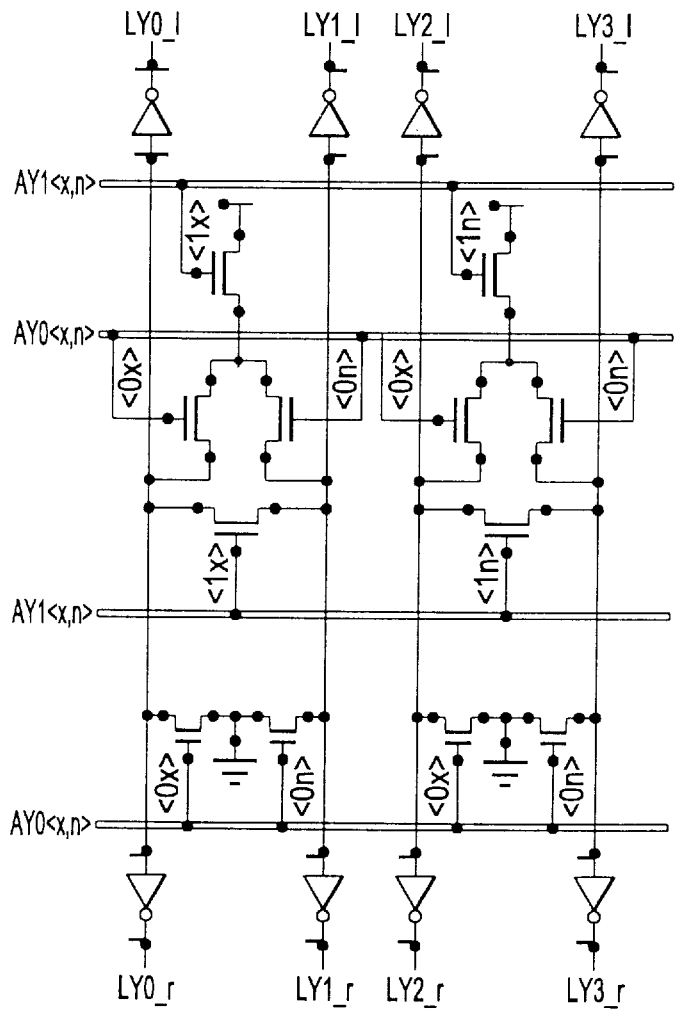
Figure 8:
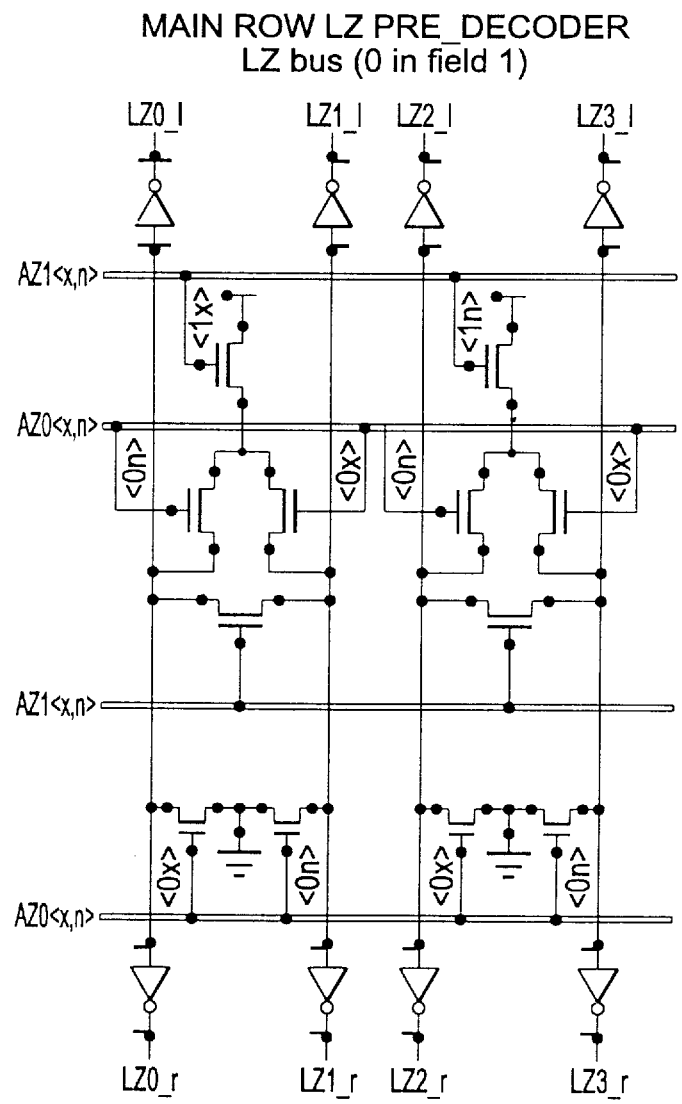

The main row predecoding block LX_LY_LZ_ROW_PRE_DEC comprises a first predecoding structure LX, shown in detail in FIG. 6, a second predecoding structure LY whose details are depicted in FIG. 7, and a third predecoding structure LZ whose details are depicted in FIG. 8. The first predecoding structure LX of FIG. 6 drives through two distinct arrays of buffers and independently one from the other, two identical buses of eight lines each, respectively for the left (l) and right (r) sectors of the memory, thus halving the capacitive load and resistance of each line.

The second and third predecoding structures, whose circuit details are shown in FIGS. 7 and 8, respectively, drive through respectively distinct batteries of buffers, two distinct buses, LY and LZ, each of four lines, one for the left (l) sector and the other for the right (r) sector of the memory. In all the three predecoding structures, selection is made by bringing one line of each block to ground potential.

Figure 10:
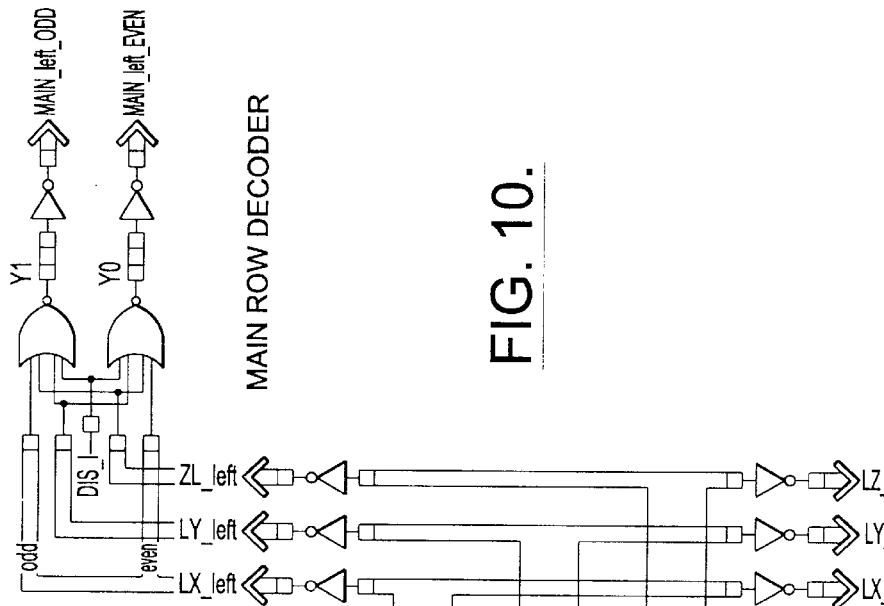
FIGS. 9 and 10 show an embodiment of the blocks of double main row decoding.
Figure 9:
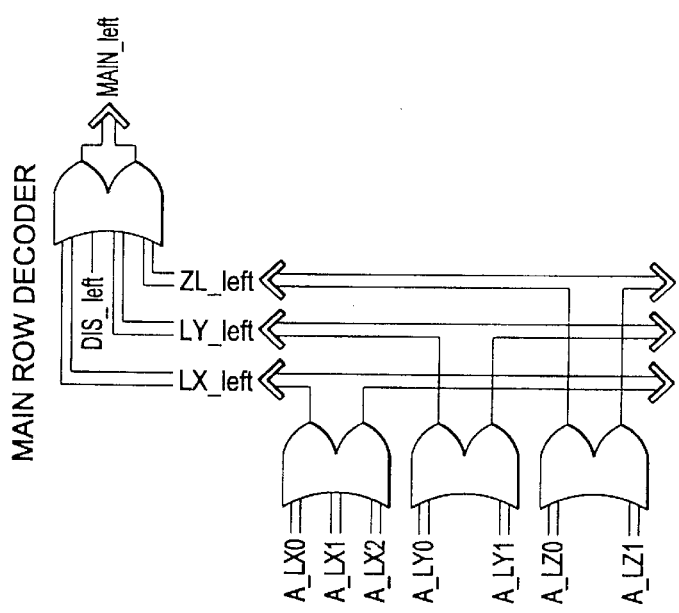

Moreover, each block contains a double main row decoding structure as indicated in FIGS. 9 and 10 by the relative symbols whose meaning is explained hereinbelow. These main row decoding structures (basically made of NOR gates), as already mentioned before, should be such as to minimize the number of transistors required for their realization. The circuit diagrams of the special S_NOR gates used and the dual S_NAND gates, and the relative symbols used in the drawings for their identification are shown respectively in FIGS. 18 and 19. These S_NOR structures, and dually the S_NAND structures, are organized by the pairs and offer the advantage of reducing the number of transistors required due to the sharing of output lines.

Indeed, if an independent pair of three input NOR gates requires 12 devices (6 Nch and 6 Pch) to realize them with C_MOS characteristics, a functionally equivalent S_NOR structure would require only 8 devices (4 Nch and 4 Pch). Such a reductive solution in terms of elementary load is magnified at the global level of the memory device in view of the remarkably large number of these elementary structures. This is so because the devices having invariant characteristics in relation to their inputs may be common for two lines as far as their paths towards GND or VDD are concerned.

In this manner, it occurs that in an S_NOR structure, all the Nch devices having the same stimulation that functionally connects the two lines are single rather than double due to the "bidirectionality" of the structure. On the Pch path, the same concept of reduction of the total number of devices is realized through a serialization of the devices.

Figure 18:
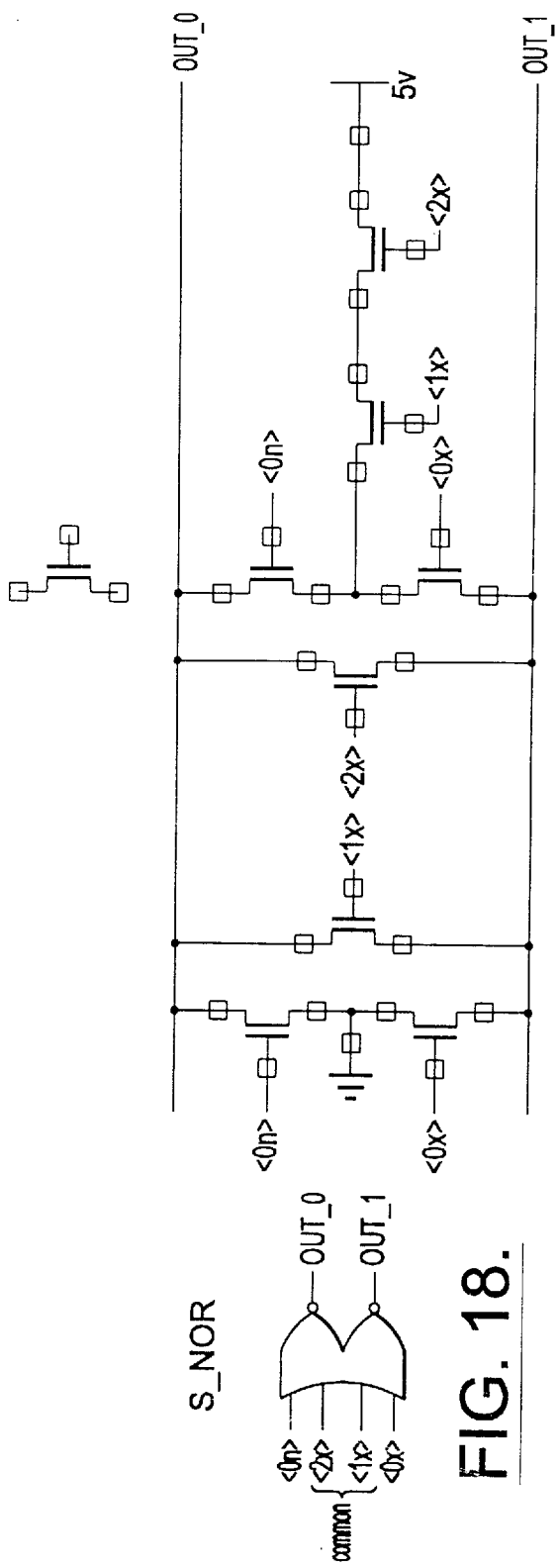
FIGS. 18 and 19 show the functional block symbol and the circuit of an S_NOR and an S_NAND gate, respectively.
Figure 19:
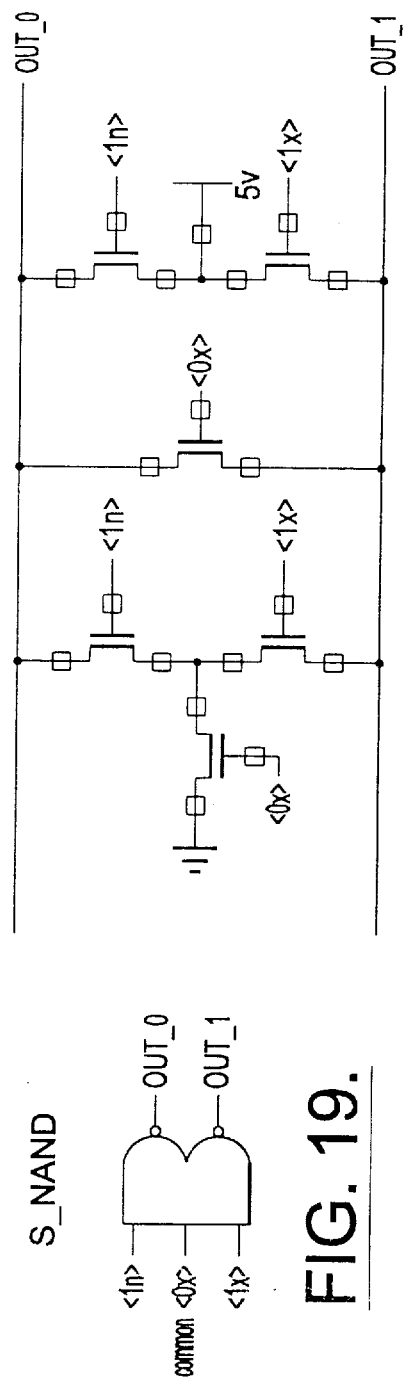

By way of simplicity, we refer to this type of particularly efficient decoding structures with the notations S_NOR and S_NAND gates and graphically with the relative symbols, as defined in FIGS. 18 and 19. Each S_NOR decoding structure is separately driven by the three buses LX, LY and LZ previously generated by the respective main predecoding circuits and by a further disabling line DIS, for the left and right sector of the memory, which permits singling out the memory block to be accessed.

FIG. 9 shows a simplified functional scheme of a main row decoder, while FIG. 10 shows in greater detail the main row decoding system and highlights the even/odd line decoding stage for the main row decoding bus of the right and of left sectors of the memory. The main lines are active when at a logic "0" and this may occur (during the normal functioning of the device) only for one line at a time. The main line that assumes the "0" state selects and activates a local structure for each subblock, which therefore requires a logic level "0" of the main line in order to be stimulated.

The whole main row decoding structure minimizes the number of main decoding lines required by the hierarchical decoder, reduces the loads (represented by a relatively low number of devices), of each main row decoding line, determines an optimal arrangement of the network with respect to the speed of propagation of the selection signals, reduces the encumbrance of both the main row predecoding circuits (by virtue of the reduced number of transistors required to realize the S_NOR gates) and of the main row decoding circuits (by virtue of an easier accessibility of the available spaces), and provides also for adequate forcing conditions to perform testing functions, such as the so-called DS and GS tests.

FIGS. 11 to 17 show the structures of local row predecoding and decoding. The local decoding network comprises a plurality of local predecoding structures. Each is made up of two identical structures, indicated in FIGS. 4A–4D as P-DEC and Q-DEC, disposed by pairs along the central aisle that separates the memory subblocks of the right sector from those of the left sector, and interleaved with the column predecoding circuits YMDEC, YNDEC, which, through the relative arrays of buffers, drive the respective column multiplexers LCOL_MUX and RCOL_MUX. These column multiplexers may be advantageously realized according to what described in the European patent application No. 96830275.2, filed on May 13, 1996, assigned to the present assignee, the entire content of which is herein incorporated by reference.

Figure 11:
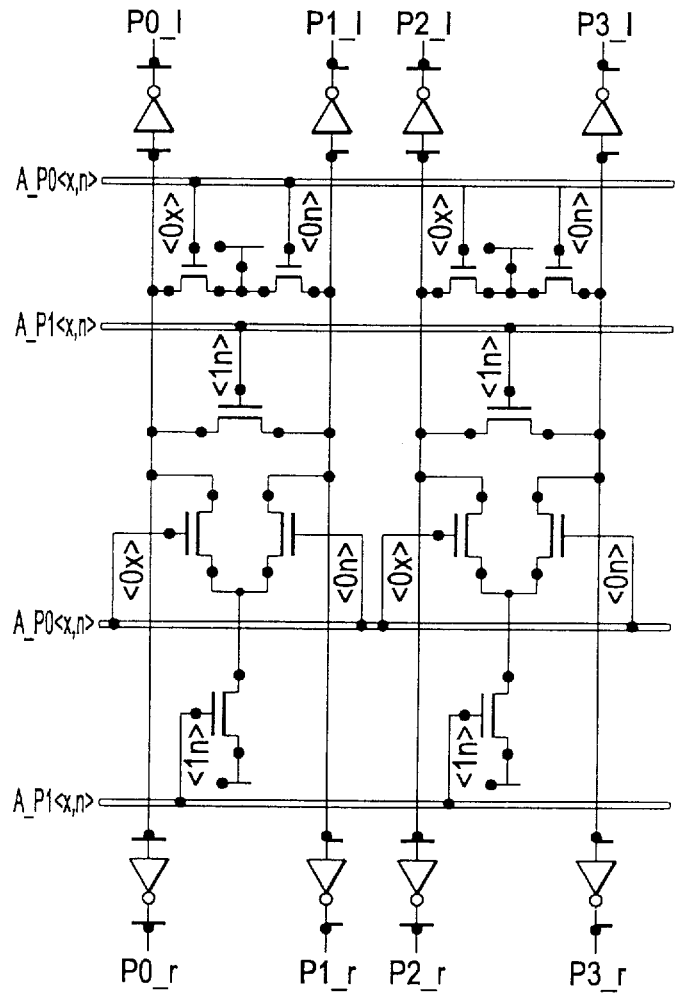
FIGS. 11 and 12 show an embodiment of two local row predecoding circuits.
Figure 12:
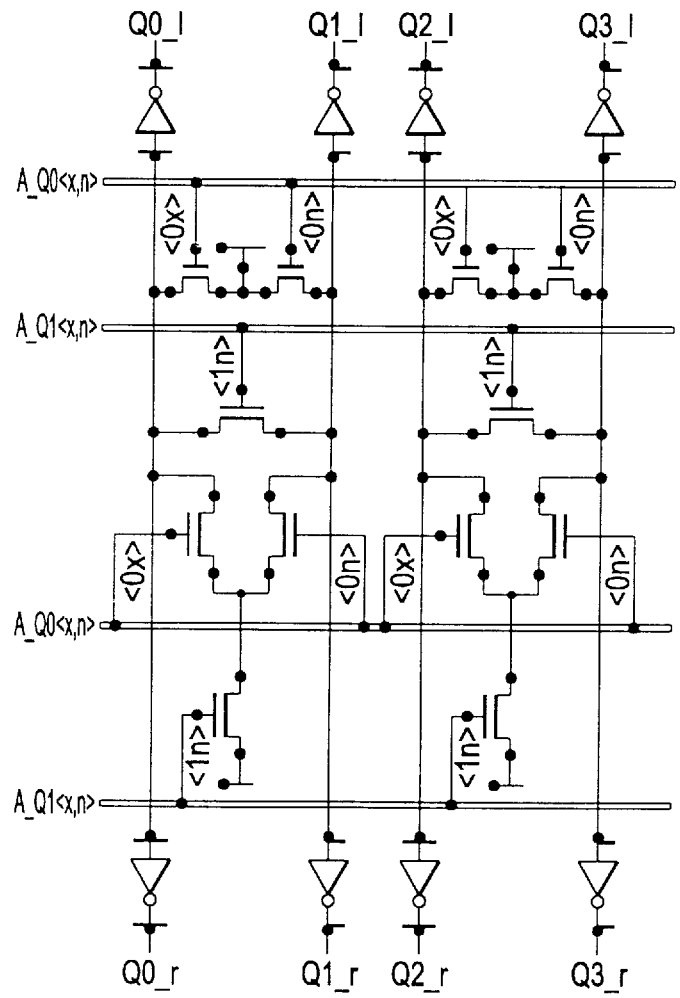

The two distinct structures of local row predecoding are respectively illustrated in FIGS. 11 and 12. Each structure: local ROW P PRE_DECODER and local ROW Q_PREDECODER, respectively, comprises a plurality of S_NAND gates, properly buffered. Through the respective arrays of buffers they independently drive two distinct buses, P and Q, each of four lines, respectively for the right and left sectors. For each of the two buses, there exists one and only one line at logic level "1" while all other lines are at logic level "0". The two buses are combined in all possible configurations and only the one that verifies the coincidence between the P and Q buses ("1"×"1") stimulates the assumption of the logic state "1" of one of the sixteen local lines of the local row decoder.

Figure 13:
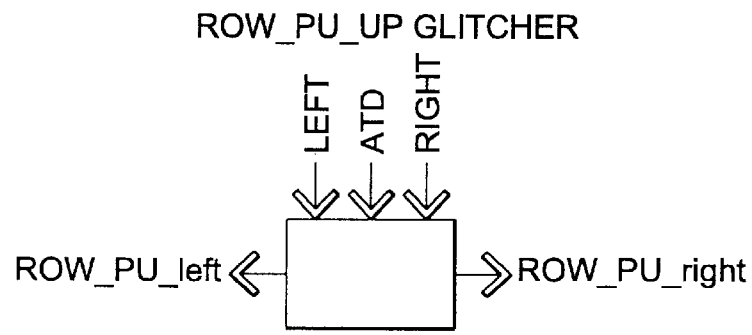
FIGS. 13 and 14 are respectively a block diagram and a circuit scheme of an optional ROW_PULL_UP_GLITCHER circuit.
Figure 14:
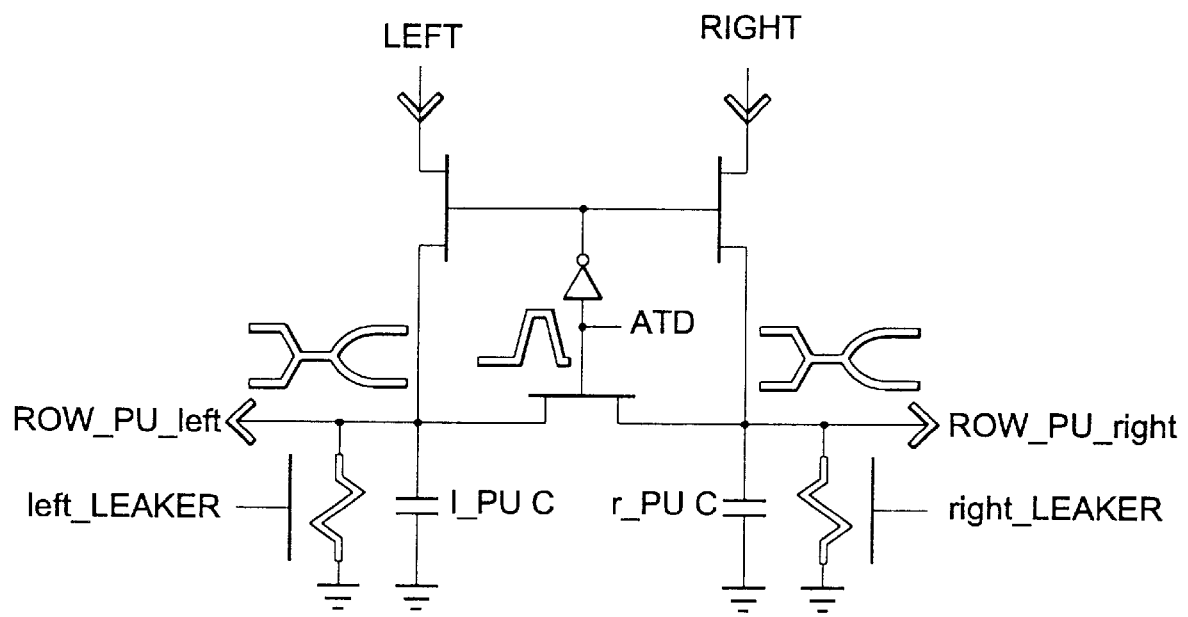

To each local row decoding block may be advantageously associated a circuit of ROW_PU_UP GLITCHER as illustrated in FIGS. 13 and 14. Advantageously, this circuit may be realized according to what is described in the European patent application No. 96830047.5, filed on Feb. 5, 1996, assigned to the present assignee, the entire content of which is herein incorporated by reference.

The ROW_PU line biases the pull-up device of the local row decoding circuit and is dynamically synchronized with the ADT pulse in order to modulate the conductivity of the pull-up transistors. This expedient improves the dynamic characteristics and the static behavior of the local row decoding structure and is conveniently implemented because of the perfect line symmetry.

Figure 15:
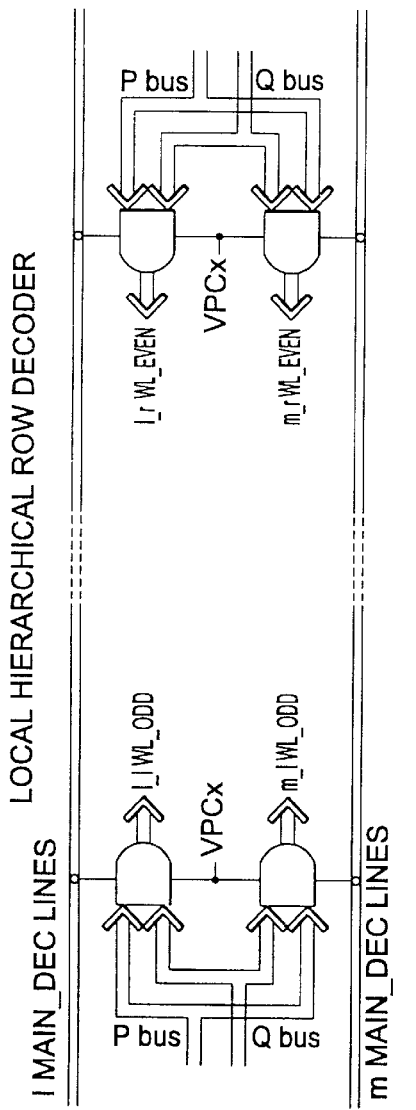
FIGS. 15, 16 and 17 show embodiments of local row decoding circuits.
Figure 16:
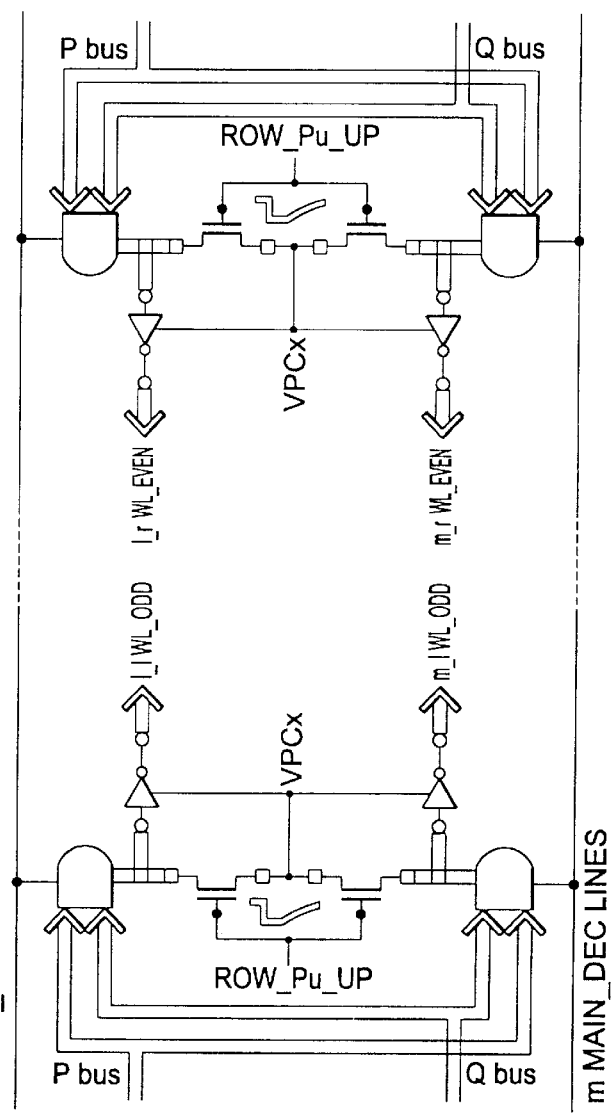
Figure 17:
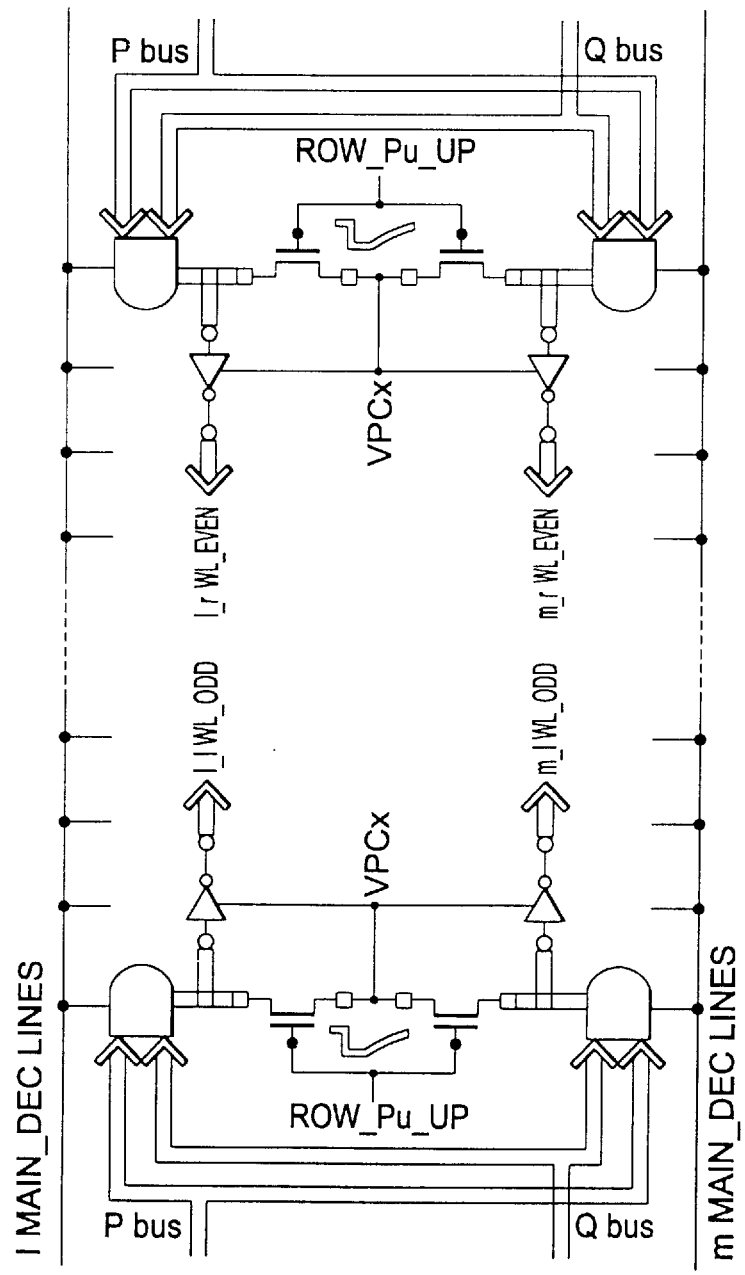

The local row decoder is further exemplified in greater detail in FIGS. 15, 16 and 17. To each main line is associated a local structure, each of sixteen local lines. The local lines of even order are stimulated by decoders and drivers realized along one side of a subblock, while those of the lines of odd order are similarly arranged along the opposite side of the subblock. The two orders of lines are properly interleaved among themselves and realize, in the central region of the subblock, a contact between the metal 2 and the relative polysilicon word-line in a complementary manner: the even lines coming from the first side and the odd lines coming from the opposite side, without ever crossing each other.

The lines of both the even and odd order are stimulated by the same main line and the selection of the local subblock is effected by the selection of the only main line at the logic value "0". The on-site selection of the local line is effected by performing a logic product of the local decoding buses P and Q. Both the buses include four lines of which only one is at the logic level "1". The logic product that tests the simultaneity of the logic level "1" of a P and of a Q line singles out the selected word-lines. Four sub-word-lines, each with distinct decoding and buffering means, are simultaneously activated and together constitute an entire word-line. Each word-line segment is stimulated by its driver at its middle point, through a connection realized with a material that is more conductive than the usual silicide thereby reducing propagation times and achieving a remarkable reduction of encumbrance, complexity and total capacitive load because of the lower number of devices.

The schemes of the figures make use of symbols and notations that are common in the art, in addition to the particular symbol adopted to identify the above described S_NOR and S_NAND structures, and as would be readily understood by those skilled in the art. A detailed description of the circuits and of the components appears, in the present context, superfluous or unnecessary for a full understanding of the invention or for practicing it by those skilled in the art.

The local row decoding system of the invention permits an interleaved selection of word-lines (WL) and consequently to increase the pitch of lines patterned in an overhanging conductive layer, thus improving fabrication reliability and, together with the central strapping of the word-lines, according to the preferred embodiment shown in FIG. 4, achieves an important improvement of the propagation speed of the signals. Criticality of the fabrication technology is relaxed by the alternating strapping: one line in metal 2 every two word-lines. The encumbrance of the circuit blocks that make up the local row decoding structure is relatively modest and by virtue of the modularity of the structure, such blocks may be repeated several times, thus advantageously segmenting the propagation lines in order to enhance speed even further. The GS test condition (all the word-lines at logic "1") is carried out by forcing simultaneously all the primary addresses at "1", both in real and inverted forms.

I claim:

1. A nonvolatile static memory comprising:
    a matrix of elementary cells addressable through bit-lines (columns) and word-lines (rows) mutually orthogonal among each other, said matrix forming an array being divided in two orders of subblocks, respectively left and right, aligned in a direction of extension of the word-lines and symmetrical by pairs;
    an address bus;
    at least one row predecoding circuit and a plurality of local row decoding circuits for said subblocks;
    column predecoding circuits and a plurality of multiplexer circuits for said subblocks controlled by said column predecoding circuits;
    a first main predecoding circuit of said address bus generating a first bus, a second bus and a third bus;
    a pair of main row decoding circuits combining signals of said first, second and third buses and generating a resulting number of main row decoding lines, each stimulating respective local row decoding circuits of said right and left subblocks; and
    two pairs of local row predecoding circuits for each of said right and left subblocks, a first pair for word-lines of even order and a second pair for word-lines of odd order of said right and left subblocks, respectively, stimulated by said address bus and generating a fourth bus and a fifth bus, respectively;
    said main row decoding circuits of said right and left subblocks being stimulated by said fourth and fifth buses, respectively.

2. The memory according to claim 1, wherein the word-lines of each subblock further comprise central strapping to lines patterned in a more conductive adjacent layer having a complementary arrangement and extending from opposite sides of the subblock.

3. The memory according to claim 2, further comprising address bus lines extending in a central aisle between said right subblocks and said left subblocks for stimulating the local row predecoding circuits; wherein said pairs of local row predecoding circuits are realized in said central aisle and are interleaved, two-by-two, among said multiplex er circuits in spaces directly opposite to respective local row decoding circuits; and wherein each of said two main row decoding circuits are at one end of the respective array of said left and right subblocks and the local row decoding circuits are interleaved among each other.

4. The memory according to claim 1, further comprising right and left arrays of buffers connected to said local row predecoding circuits so that said local row predecoding circuits stimulate simultaneously two distinct local row decoding circuits for the right and left subblocks, respectively, through the right and left arrays of buffers.

5. The memory according to claim 1, further comprising individually buffered lines connected to each main and local decoding circuits so that each main and local decoding structure is stimulated through the individually buffered lines.

6. The memory according to claim 1, wherein each main row decoding line addresses and activates/deactivates simultaneously a plurality of local decoding circuits, each circuit controlling a plurality of lines.

7. The memory according to claim 6, wherein each main row decoding line is active when at a logic state "0" and any instant only one line of any one entire set of said main row decoding lines are in such a logic state "0".

8. The memory according to claim 6, wherein each local decoding circuit implements a logic product of said fourth and fifth buses.

9. The memory according to claim 8, wherein said fourth and fifth buses comprise four lines each, only one of which is at a logic state "1" at any instant.

10. The memory according to claim 8, wherein a logic product implemented locally between said fourth and fifth buses verifies a coincidence of two lines at a logic level "1" of the two buses, and the corresponding presence of a main line at a logic state "0", determine the simultaneous selection of the word-lines of each subblock.

11. The memory according to claim 1, wherein all the predecoding circuits comprise at least one of S__NOR and S__NAND structures.

12. The memory according to claim 1, wherein the column predecoding circuits are stimulated simultaneously through primary address lines on which exist electrical loads deriving solely from the local predecoding circuits.

13. The memory according to claim 12, wherein said column predecoding circuit each includes two groups of S__NAND gates, and independent buffers associated therewith, respectively for the right and left subblocks.

14. A nonvolatile static memory comprising:
a matrix of elementary cells addressable through bit-lines (columns) and word-lines (rows) mutually orthogonal among each other, said matrix forming an array being divided in two orders of subblocks, respectively left and right, aligned in a direction of extension of the word-lines and symmetrical by pairs;
an address bus;
at least one row predecoding circuit and a plurality of local row decoding circuits for said subblocks;
column predecoding circuits and a plurality of multiplexer circuits for said subblocks controlled by said column predecoding circuits;
a first main predecoding circuit of said address bus generating a first bus, a second bus and a third bus;
a pair of main row decoding circuits combining signals of said first, second and third buses and generating a resulting number of main row decoding lines, each stimulating respective local row decoding circuits of said right and left subblocks;
two pairs of local row predecoding circuits for each of said right and left subblocks, a first pair for word-lines of even order and a second pair for word-lines of odd order of said right and left subblocks, respectively, stimulated by said address bus and generating a fourth bus and a fifth bus, respectively;
said main row decoding circuits of said right and left subblocks being stimulated by said fourth and fifth buses, respectively;
the word-lines of each subblock further comprising central strapping to lines patterned in a more conductive adjacent layer having a complementary arrangement and extending from opposite sides of the subblock; and
right and left arrays of buffers connected to said local row predecoding circuits so that said local row predecoding circuits stimulate simultaneously two distinct local row decoders for the right and left subblocks, respectively, through the said right and left arrays of buffers.

15. The memory according to claim 14, further comprising address bus lines extending in a central aisle between said right subblocks and said left subblocks for stimulating the local row predecoding circuits; wherein said pairs of local row predecoding circuits are realized in said central aisle and are interleaved, two-by-two, among said multiplexer circuits in spaces directly opposite to respective local row decoding circuits; and wherein each of said two main row decoding circuits are at one end of the respective array of said left and right subblocks and the local row decoding circuits are interleaved among each other.

16. The memory according to claim 14, further comprising individually buffered lines connected to each main and local decoding circuits so that each main and local decoding circuit is stimulated through the individually buffered lines.

17. The memory according to claim 14, wherein each main row decoding line addresses and activates/deactivates simultaneously a plurality of local decoding circuits, each circuit controlling a plurality of lines.

18. The memory according to claim 17, wherein each main row decoding line is active when at a logic state "0" and any instant only one line of any one entire set of said main row decoding lines are in such a logic state "0".

19. The memory according to claim 17, wherein each local decoding circuit implements a logic product of said fourth and fifth buses.

20. The memory according to claim 19, wherein said fourth and fifth buses comprise four lines each, only one of which is at a logic state "1" at any instant.

21. The memory according to claim 14, wherein a logic product implemented locally between said fourth and fifth buses verifies a coincidence of two lines at a logic level "1" of said fourth and fifth buses, and a corresponding presence of a main line at a logic state "0", determines a simultaneous selection of the word-lines of each subblock.

22. The memory according to claim 21, wherein all the predecoding circuits comprise at least one of S__NOR and S__NAND structures.

23. The memory according to claim 14, wherein the column predecoding circuits are stimulated simultaneously through primary address lines on which exist electrical loads deriving solely from the local predecoding circuits.

24. The memory according to claim 23, wherein each column predecoding circuit includes two groups of S__NAND gates, and independent buffers associated therewith, respectively for the right and left subblocks.

* * * * *